US010634740B2

(12) United States Patent
Ohta et al.

(10) Patent No.: US 10,634,740 B2
(45) Date of Patent: Apr. 28, 2020

(54) MAGNETIC SENSOR AND METHOD OF MANUFACTURING THE SAME

(71) Applicant: TDK Corporation, Tokyo (JP)

(72) Inventors: Naoki Ohta, Tokyo (JP); Keisuke Takasugi, Tokyo (JP)

(73) Assignee: TDK Corporation, Tokyo (JP)

( * ) Notice: Subject to any disclaimer, the term of this patent is extended or adjusted under 35 U.S.C. 154(b) by 117 days.

(21) Appl. No.: 15/679,284

(22) Filed: Aug. 17, 2017

(65) Prior Publication Data

US 2018/0224510 A1      Aug. 9, 2018

(30) Foreign Application Priority Data

Feb. 9, 2017 (JP) .................................. 2017-022421

(51) Int. Cl.
| | |
|---|---|
| *G01R 33/09* | (2006.01) |
| *G01R 33/00* | (2006.01) |
| *G07D 7/04* | (2016.01) |
| *H01L 43/08* | (2006.01) |
| *H01L 43/12* | (2006.01) |

(52) U.S. Cl.
CPC ........ *G01R 33/093* (2013.01); *G01R 33/0011* (2013.01); *G01R 33/091* (2013.01); *G07D 7/04* (2013.01); *H01L 43/08* (2013.01); *H01L 43/12* (2013.01)

(58) Field of Classification Search
CPC .............. G01R 33/093; G01R 33/0011; G01R 33/091; H01L 43/08; H01L 43/12
USPC ..................................................... 324/207.21
See application file for complete search history.

(56) References Cited

U.S. PATENT DOCUMENTS

| | | | | |
|---|---|---|---|---|
| 2004/0150397 A1* | 8/2004 | Kuroe | ..................... | G01R 33/02 |
| | | | | 324/249 |
| 2017/0160351 A1* | 6/2017 | Yamamoto | ............. | G01C 17/30 |
| 2017/0328963 A1* | 11/2017 | Schmitt | ............. | G01R 33/0052 |

FOREIGN PATENT DOCUMENTS

| | | | | |
|---|---|---|---|---|
| DE | 102014116953 A1 * | 5/2016 | ........ | G01R 33/0052 |
| JP | 2013-172040 A | 9/2013 | | |
| JP | 2014-006118 A | 1/2014 | | |

(Continued)

OTHER PUBLICATIONS

Office action dated Mar. 20, 2018 issued in corresponding JP patent application No. 2017-022421 (and English translation thereof).

*Primary Examiner* — Melissa J Koval
*Assistant Examiner* — Courtney G McDonnough
(74) *Attorney, Agent, or Firm* — Posz Law Group, PLC

(57) ABSTRACT

A magnetic sensor having a yoke that can achieve large magnetic flux density and that can be accurately formed is provided. The magnetic sensor includes magnetic field detection element 21 that detects a magnetic field in first direction X and first yoke 23 that is located near magnetic field detection element 21 and extends in second direction Z that is orthogonal to first direction X. First yoke 23 includes first portion 23a that is located away from magnetic field detection element 21 at least in first direction X and second portion 23b that is located farther away from magnetic field detection element 21 than first portion 23a with respect to second direction Z. The second portion 23b has surface 23f that is opposite to interface 23d with the first portion 23a, surface 23f having a curved shape that protrudes in a direction away from the first portion 23a.

6 Claims, 10 Drawing Sheets

(56) References Cited

FOREIGN PATENT DOCUMENTS

WO 2009/151023 A1 12/2009
WO 2015-170509 A1 11/2015

* cited by examiner

Fig.1
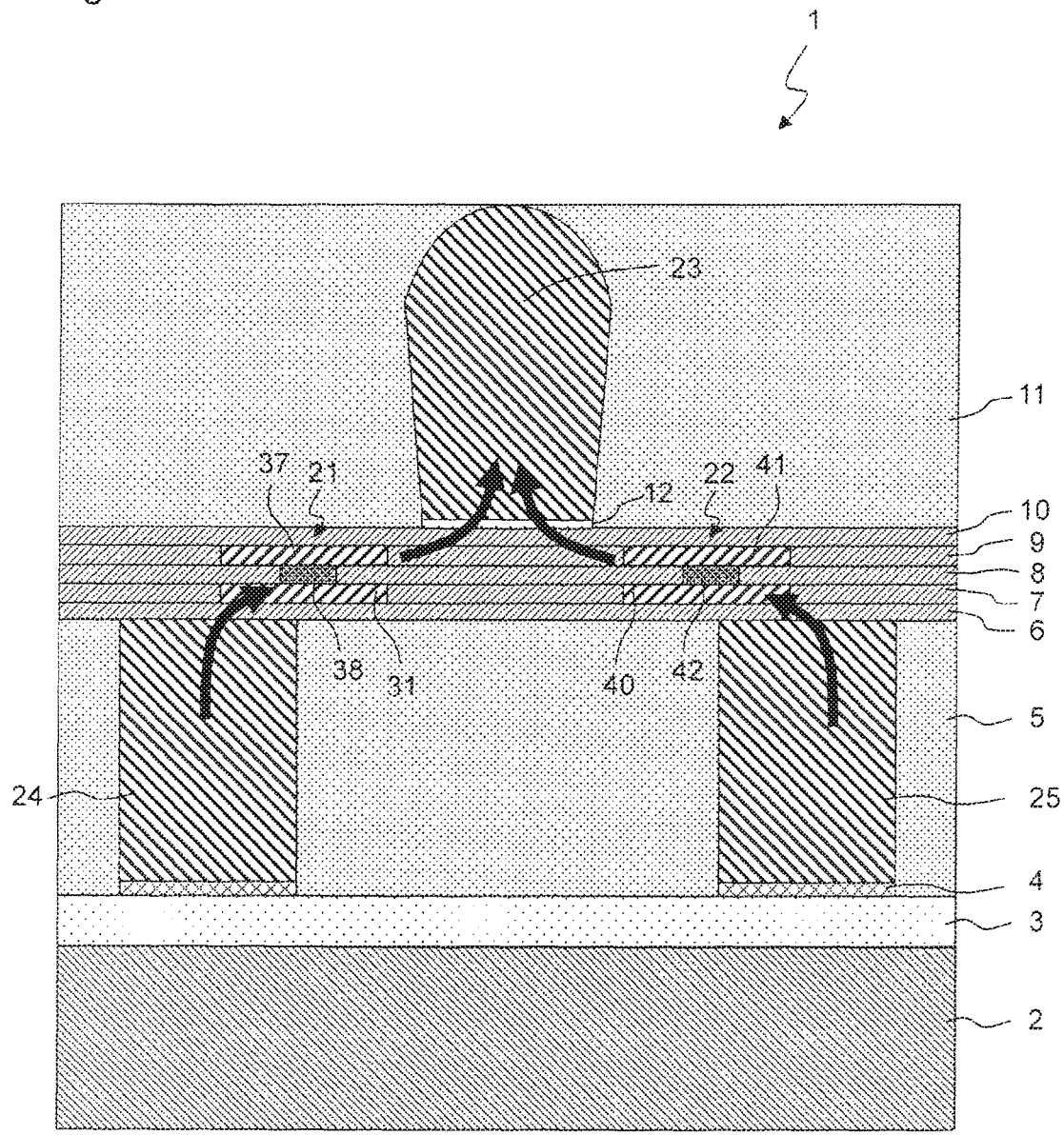
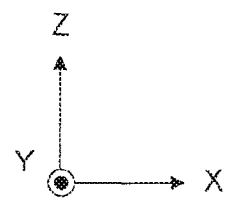

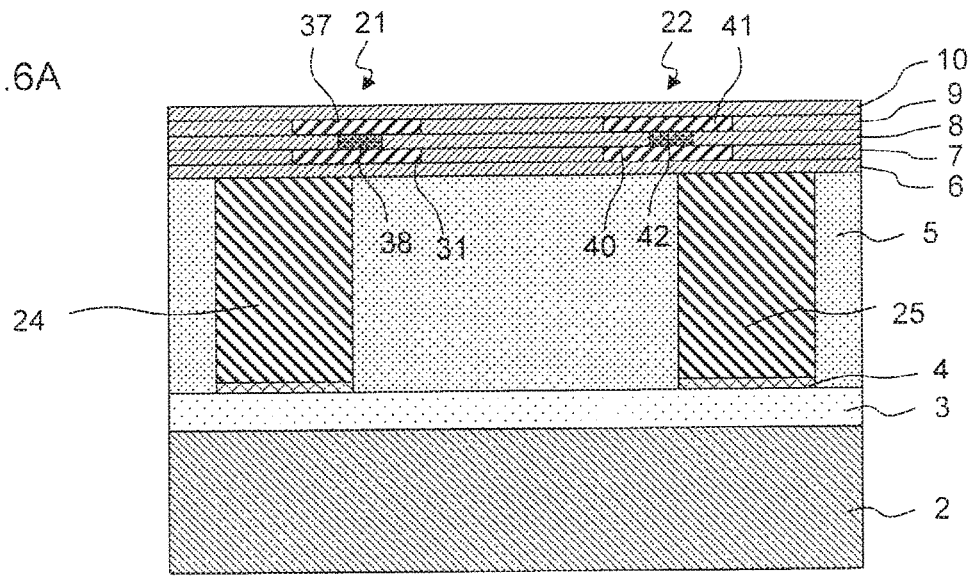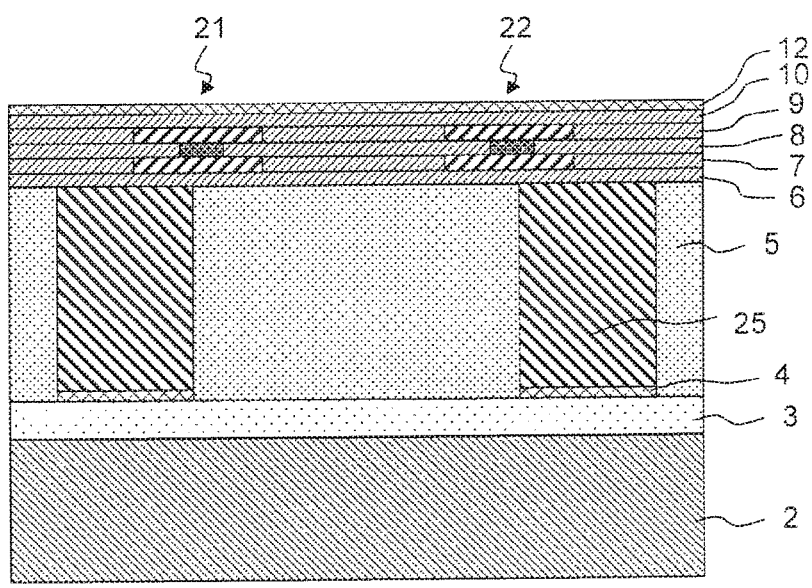

Comparative Example 1

Comparative Example 2

Example

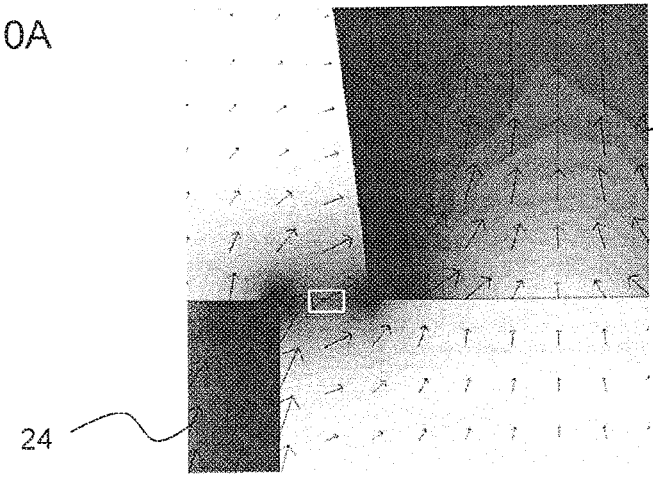
Fig.10A — Comparative Example 1
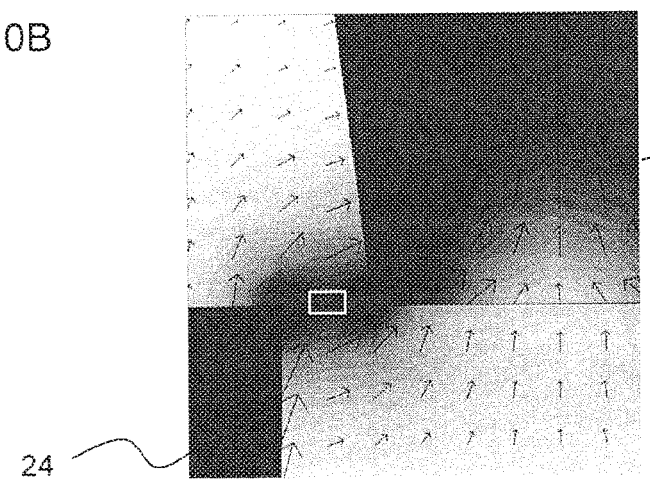
Fig.10B — Comparative Example 2
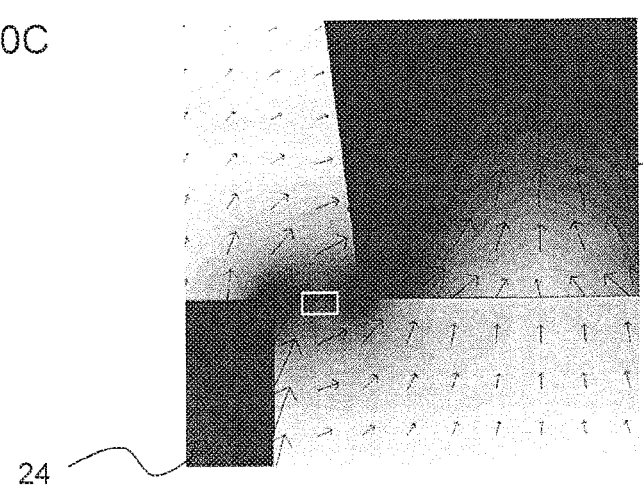
Fig.10C — Example

MAGNETIC SENSOR AND METHOD OF MANUFACTURING THE SAME

BACKGROUND OF THE INVENTION

Field of the Invention

The present invention relates to a magnetic sensor and a method of manufacturing the same, and particularly to the configuration of a yoke of the magnetic sensor.

Description of the Related Art

A magnetic sensor may be provided with a yoke near a magnetic field sensing film in order to guide magnetic flux in the magnetic field sensing direction of the magnetic field sensing film. WO 2009/151023 discloses a magnetic sensor that includes a magnetic field sensing film that detects a magnetic field in a first direction and a yoke that faces the magnetic field sensing film in the first direction. The yoke has an end portion that protrudes in the first direction toward the magnetic field sensing film, and guides the magnetic flux in the first direction. JP2013-172040A discloses a magnetic sensor in which a yoke that extends in a direction that is orthogonal to the magnetic field sensing direction of a magnetic field sensing film (hereinafter referred to as a second direction) is arranged adjacent to the magnetic field sensing film.

SUMMARY OF THE INVENTION

The magnetic sensor disclosed in WO 2009/151023 requires a large area in the first direction in order to arrange the yoke because the yoke extends in the first direction (lateral direction). In order to limit the area for arranging the yoke, it is desirable that a yoke that extends in the second direction (vertical direction), which is orthogonal to the magnetic field sensing direction of the magnetic field sensing film, be provided in the manner as disclosed in JP2013-172040A. However, in this case, it is necessary to increase the height of the yoke, or the dimension of the yoke in the second direction, in order to increase the magnetic flux density of the yoke that is arranged in the vertical direction. Since the yoke is formed by means of plating in the wafer process, plating needs to be formed in a deep hole of a resist. However, such a plating process is disadvantageous in terms of ensuring the accuracy with which the plating is formed.

It is an object of the present invention to provide a magnetic sensor having a yoke that can achieve large magnetic flux density and that can be accurately formed.

A magnetic sensor comprises a magnetic field detection element that detects a magnetic field in a first direction, and a first yoke that is located near the magnetic field detection element and that extends in a second direction that is orthogonal to the first direction. The first yoke includes a first portion that is located away from the magnetic field detection element at least in the first direction and a second portion that is located farther away from the magnetic field detection element than the first portion with respect to the second direction. The second portion has a surface that is opposite to an interface with the first portion, the surface having a curved shape that protrudes in a direction away from the first portion.

A method of manufacturing a magnetic sensor comprises the steps of forming a magnetic field detection element that detects a magnetic field in a first direction, forming a resist that covers the magnetic field detection element in a second direction that is orthogonal to the first direction, forming a hole in the resist at a position away from the magnetic field detection element in the first direction, the hole extending in the second direction from an upper surface of the resist, forming a yoke in and above the hole of the resist by means of plating, and removing the resist.

According to the magnetic sensor of the present invention, the second portion has a surface having a curved shape that protrudes in a direction away from the first portion. The method of manufacturing a magnetic sensor of the present invention includes a step of forming a yoke above a hole of a resist by means of plating, which enables the formation of a yoke having a height that exceeds the depth of the hole of the resist. Accordingly, the present invention can provide a magnetic sensor having a yoke that can achieve large magnetic flux density and that can be accurately formed.

BRIEF DESCRIPTION OF THE DRAWINGS

FIG. 1 is a partial cross sectional view illustrating a magnetic sensor according to a first embodiment of the present invention;

FIGS. 4A to 7B are diagrams illustrating the manufacturing processes of the magnetic sensor in FIG. 1;

FIGS. 10A to 10C are partial enlarged views of FIGS. 9A to 9C, respectively.

DETAILED DESCRIPTION OF THE PREFERRED EMBODIMENTS

Figure 2A:
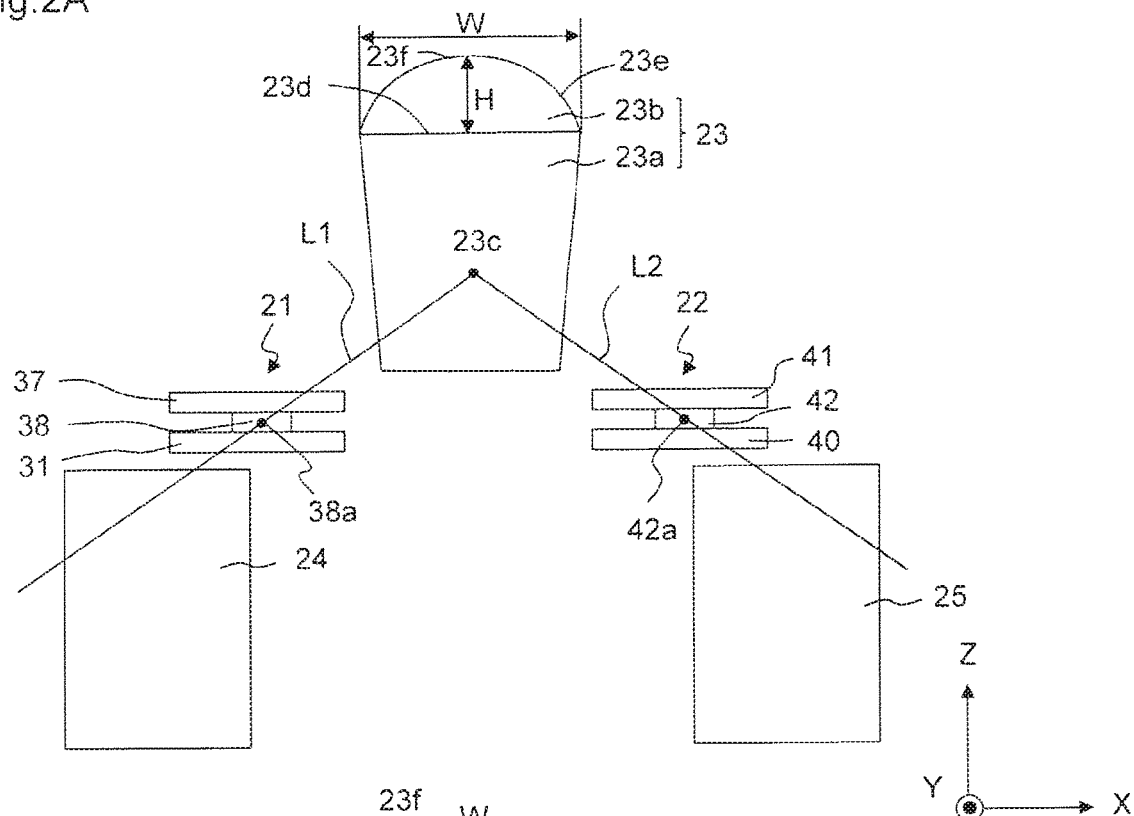
FIGS. 2A, 2B are diagrams illustrating only yokes and magnetic field detection elements in FIG. 1.

Hereinafter, some embodiments of the present invention will be described with reference to the drawings. FIG. 1 is a partial cross-sectional view illustrating a magnetic sensor according to a first embodiment of the present invention. Magnetic sensor 1 has a plurality of magnetic field detection elements and a plurality of yokes. The yoke guides magnetic flux in the magnetic field sensing direction of the magnetic field detection element, and the magnetic flux that is guided in the magnetic field sensing direction by the yoke is detected by the magnetic field detection element. The magnetic field detection elements are interconnected by a bridge circuit (not illustrated) or the like, and thereby magnetic sensor 1 can measure external magnetic field. FIG. 1 illustrates magnetic sensor 1 that includes first and second magnetic field detection elements 21, 22 that are adjacent to each other and first to third yokes 23, 24, 25 that are arranged near magnetic field detection elements 21, 22. FIG. 2A is a diagram illustrating only first and second magnetic field detection elements 21, 22 and first to third yokes 23, 24, 25 in FIG. 1, for convenience of description.

In the following description, the first direction is a magnetic field sensing direction in which first and second magnetic field sensing films 38, 42 detect a magnetic field. The first direction also corresponds to the direction in which first magnetic field sensing film 38 and second magnetic field sensing film 42 are arranged. The second direction is orthogonal to the first direction. The second direction corresponds to the direction in which upper lead 37 and lower lead 31 of first magnetic field detection element 21 are arranged. The second direction also corresponds to the direction in which upper lead 41 and lower lead 40 of second magnetic field detection element 22 are arranged. The first direction is orthogonal to the film thickness direction of first and second magnetic field sensing films 38, 42, and the second direction is parallel to the film thickness direction of first and second magnetic field sensing films 38, 42. The third direction is orthogonal both to the first direction and to the second direction. The first direction, the second direction and the third direction may be referred to as direction X, direction Z and direction Y, respectively. Note that that the magnetic flux is assumed to flow from second and third yokes 24, 25 to first yoke 23 in the present embodiment, but there is no difference in the configuration and effect of the present embodiment even when the magnetic flux flows from first yoke 23 to second and third yokes 24, 25.

Magnetic sensor 1 includes substrate 2, second and third yokes 24, 25 that are formed on substrate 2 via first insulation layer 3, first and second magnetic field detection elements 21, 22 that are provided above second and third yokes 24, 25, and first yoke 23 that is provided between first magnetic field detection element 21 and second magnetic field detection element 22 with regard to first direction X. In the present embodiment, first yoke 23 is away from first and second magnetic field detection elements 21, 22 in second direction Z. First to third yokes 23, 24, 25 are formed of a soft magnetic material, such as NiFe. First electrode films 4 that are formed in a plating step are provided between first insulation layer 3 and second and third yokes 24, 25.

First magnetic field detection element 21 includes first magnetic field sensing film 38 that detects a magnetic field in first direction X and a pair of first leads 31, 37. First leads 31, 37 sandwich first magnetic field sensing film 38 in second direction Z and supply sense current to first magnetic field sensing film 38. Second magnetic field detection element 22 includes second magnetic field sensing film 42 that detects a magnetic field in first direction X and a pair of second leads 40, 41. Second leads 40, 41 sandwich second magnetic field sensing film 42 in second direction Z and supply sense current to second magnetic field sensing film 42. The sense current flows in second direction Z. Hereinafter, the leads of the pairs of first and second leads on the side of substrate 2 are referred to as lower leads 31, 40, respectively, and the leads on the side opposite to lower leads 31, 40 with respect to first and second magnetic field sensing films 38, 42 are referred to as upper leads 37, 41, respectively. Second magnetic field detection element 22 is arranged away from first magnetic field detection element 21 in first direction X. First magnetic field sensing film 38 and second magnetic field sensing film 42 are provided at symmetrical positions with respect to the center line of first yoke 23 in direction Z.

First yoke 23 is provided between second yoke 24 and third yoke 25 with respect to direction X. More specifically, second yoke 24 is located on the side opposite to first yoke 23 with respect to first magnetic field sensing film 38 and lies on an extended line of straight line L1 that connects center 23c of first yoke 23 to center 38a of first magnetic field sensing film 38. Third yoke 25 is located on the side opposite to first yoke 23 with respect to second magnetic field sensing film 42 and lies on an extended line of straight line L2 that connects center 23c of first yoke 23 to center 42a of second magnetic field sensing film 42. Centers 23c, 38a, 42a are synonymous with the center of gravity. FIG. 1 schematically illustrates the flow of magnetic flux that passes through first to third yokes 23, 24, 25. The magnetic flux emitted from second and third yokes 24, 25 proceeds in the oblique and upward direction in FIG. 1 and is absorbed in first yoke 23. Specifically, the magnetic flux that proceeds in second and third yokes 24, 25 in direction Z changes its direction such that the direction has direction X component between second and third yokes 24, 25 and first yoke 23 before being absorbed in first yoke 23, and then proceeds in first yoke 23 in direction Z. First magnetic field sensing film 38 is positioned in the area between first yoke 23 and second yoke 24 that has large direction X component of the magnetic flux, and therefore the magnetic flux in direction X can be efficiently detected. The same applies to second magnetic field sensing film 42.

Second insulation layer 5 is formed on the sides of second and third yokes 24, 25. Third insulation layer 7 is formed on the sides of lower leads 31, 40. Fourth insulation layer 8 is formed on the sides of first and second magnetic field sensing films 38, 42. Fifth insulation layer 9 is formed on the sides of upper leads 37, 41. Sixth insulation layer 11 is formed on the sides of first yoke 23. First intermediate insulation layer 6 is formed between second and third yokes 24, 25 and lower leads 31, 40. Second intermediate insulation layer 10 is formed between upper leads 37, 41 and sixth insulation layer 11. First to sixth insulation layers 3, 5, 7, 8, 9, 11, and first and second intermediate insulation layers 6, 10 are formed of Al2O3. Note that first intermediate insulation layer 6 is a support layer that supports first and second magnetic field detection elements 21, 22.

Next, first and second magnetic field detection elements 21, 22 will be described.

Figure 3:
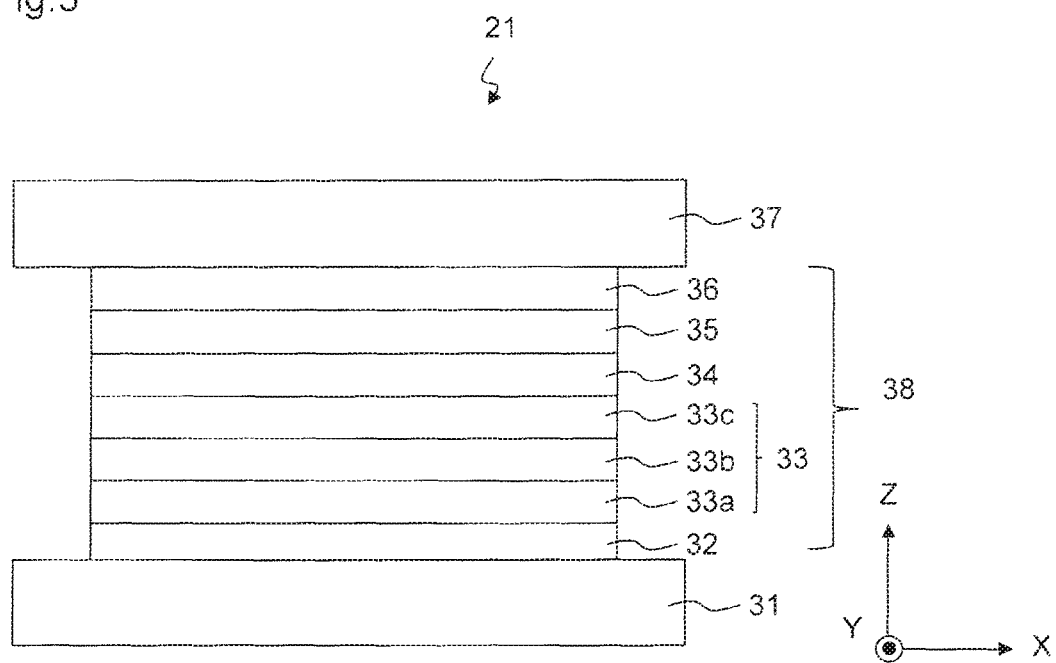
FIG. 3 is a schematic diagram illustrating the configuration of first and second magnetic field detection elements.

Since first magnetic field detection element 21 and second magnetic field detection element 22 have the same structure, only first magnetic field detection element 21 is described here. FIG. 3 is a cross-sectional view illustrating the configuration of first magnetic field detection element 21 in more detail. First magnetic field sensing film 38 of first magnetic field detection element 21 includes magnetization free layer 35, magnetization fixed layer 33 and spacer layer 34 that is sandwiched between magnetization free layer 35 and magnetization fixed layer 33. Spacer layer 34 exhibits the magneto-resistive effect. Magnetization free layer 35 is formed of a soft magnetic material, such as NiFe. The magnetization direction of magnetization free layer 35 relative to external magnetic field rotates in a plane that includes first direction X and third direction Y. Magnetization free layer 35 has a sufficiently larger length in direction Y than in direction X so that the magnetization direction is oriented in direction X due to the shape anisotropy effect. Bias layers that are formed of a hard magnetic material may be provided on both sides of magnetization free layer 35 with regard to direction X in order to orient the magnetization direction in direction X. Magnetization fixed layer 33 is formed of a soft magnetic material, such as CoFe, and the magnetization direction is fixed relative to the external magnetic field. Spacer layer 34 is a tunnel barrier layer that is formed of a nonmagnetic insulating material, such as Al2O3. Accordingly, first magnetic field detection element 21 of the present embodiment is a TMR (Tunnel Magneto Resistive) element, but may also be a so-called GMR (Giant Magneto Resistive) element in which spacer layer 34 is formed of a nonmagnetic metal layer, such as Cu.

Magnetization fixed layer 33 is formed by stacking first magnetization fixed layer 33a, nonmagnetic intermediate layer 33b and second magnetization fixed layer 33c in this order. First magnetization fixed layer 33a is formed on seed layer 32 that is formed of Ta or Ru. Second magnetization fixed layer 33c is in contact with spacer layer 34. First magnetization fixed layer 33a and second magnetization fixed layer 33c are formed of a soft magnetic material, such as CoFe, and nonmagnetic intermediate layer 33b is formed of Ru. First magnetization fixed layer 33a and second magnetization fixed layer 33c are anti-ferromagnetically coupled through nonmagnetic intermediate layer 33b. An antiferromagnetic layer that is formed of IrMn or the like and that is exchange-coupled to first magnetization fixed layer 33a may be provided under first magnetization fixed layer 33a. Magnetization free layer 35 is covered by protective layer 36 that is formed of Ta or the like. Note that first magnetic field detection element 21 and second magnetic field detection element 22 are not limited to the TMR element or the GMR element, and may be of any type of magnetic field detection elements, such as an AMR (An-Isotropic Magneto Resistive) element, as long as they can detect a magnetic field in first direction X.

First yoke 23 is partitioned into first portion 23a and second portion 23b in direction Z. First portion 23a is located away from first and second magnetic field detection elements 21, 22 in both first direction X and in second direction Z (that is, first portion 23a is located at an oblique and upward position in FIGS. 1, 2A and 2B) and extends in second direction Z. First portion 23a is formed closer to first and second magnetic field detection elements 21, 22 than second portion 23b with respect to direction Z. Second portion 23b is formed farther away from first and second magnetic field detection elements 21, 22 than first portion 23a and is in contact with first portion 23a with respect to direction Z. First portion 23a terminates on the side of second portion 23b with regard to first magnetic field sensing film 38 and second magnetic field sensing film 42. Second electrode film 12 that is formed in the plating step is provided between intermediate insulation layer 10 and first yoke 23.

The dimension of first portion 23a in direction X monotonically increases from below to above in direction Z in FIG. 2, that is, in the direction away from second and third yokes 24, 25 or substrate 2, or toward second portion 23b. The dimension of first portion 23a in direction X may be constant in direction Z. In other words, the cross section of first portion 23a may be rectangular.

The dimension of second portion 23b in direction X monotonically decreases from below to above in direction Z, that is, in the direction away from second and third yokes 24, 25, or in the direction away from first portion 23a. Surface 23f of second portion 23b that is opposite to interface 23d with first portion 23a has a curved shape that protrudes in the direction away from first portion 23a. In the embodiment illustrated in FIG. 2A, second portion 23b has a substantially dome-shaped cross section. In a modification illustrated in FIG. 2B, second portion 23b has a substantially flat top surface. In any case, each side portion 23e of second portion 23b in direction X forms a curved shape. The curvature radius of each side portion 23e of second portion 23b is about ¼ or more and about ½ or less of width W of interface 23d between first portion 23a and second portion 23b in first direction X. However, the surface of each side portion 23e of second portion 23b in direction X need not be a curved surface having a constant curvature radius, and may be formed from curved lines having different curvature radii connected to each other. Second portion 23b may be asymmetric with respect to the center line of the first portion 23a in direction Z. Maximum height H of second portion 23b is preferably about ¼ or more and about ½ or less of width W of interface 23d between first portion 23a and second portion 23b in first direction X. Second portion 23b preferably does not protrude laterally from interface 23d between first portion 23a and second portion 23b, when viewed in direction Z.

Next, a method of manufacturing magnetic sensor 1 described above will be described with reference to FIGS. 4A to 7B.

Figure 4A:
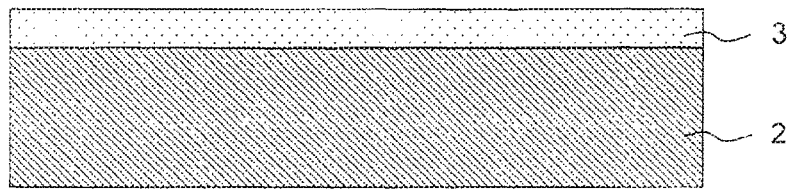
Figure 4B:
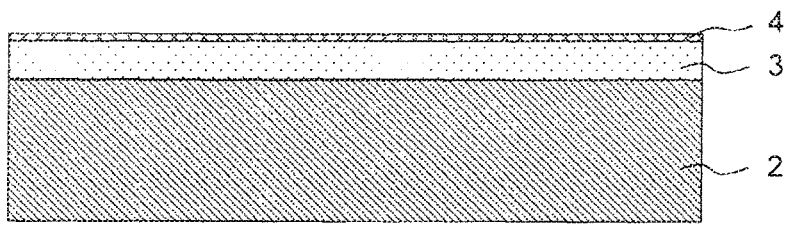
Figure 4C:
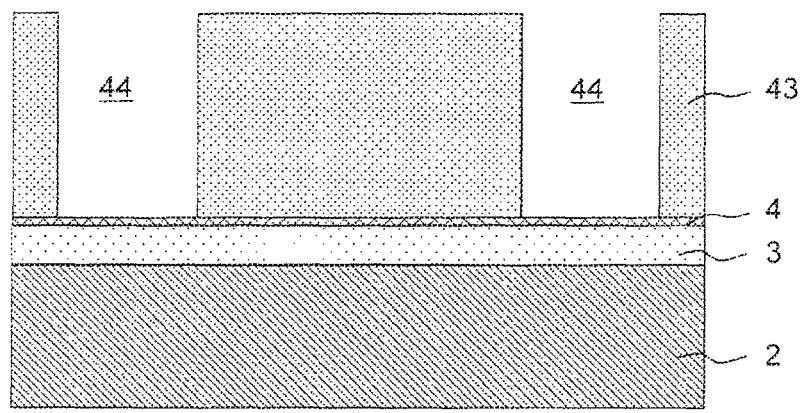
Figure 4D:
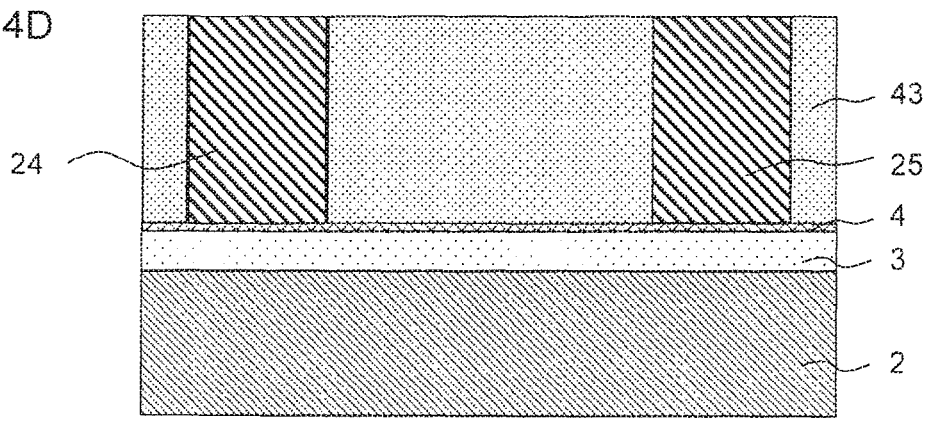

First, first insulation layer 3 is formed on substrate 2, as illustrated in FIG. 4A. Next, first electrode film 4 is formed on first insulation layer 3, as illustrated in FIG. 4B. Then, first photoresist 43 is formed on first electrode film 4, and first holes 44 for forming second and third yokes 24, 25 therein are formed by exposure and development processes, as illustrated in FIG. 4C. Next, second and third yokes 24, 25 are formed in first holes 44 by means of plating, as illustrated in FIG. 4D.

Figure 5A:
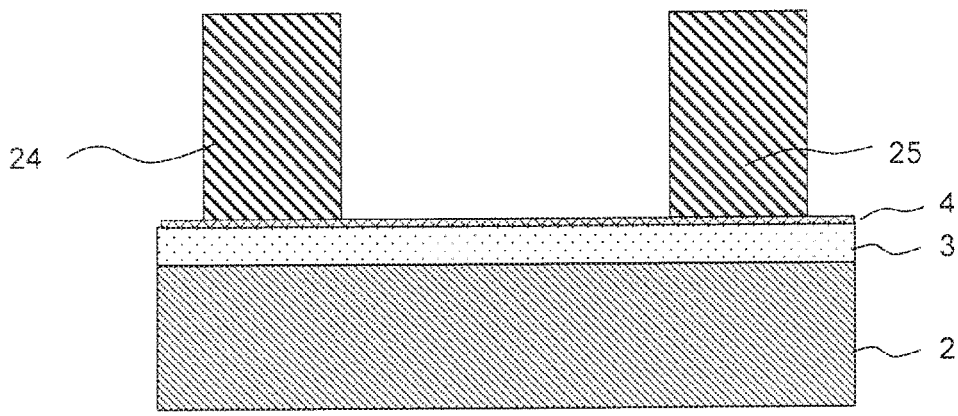
Figure 5B:
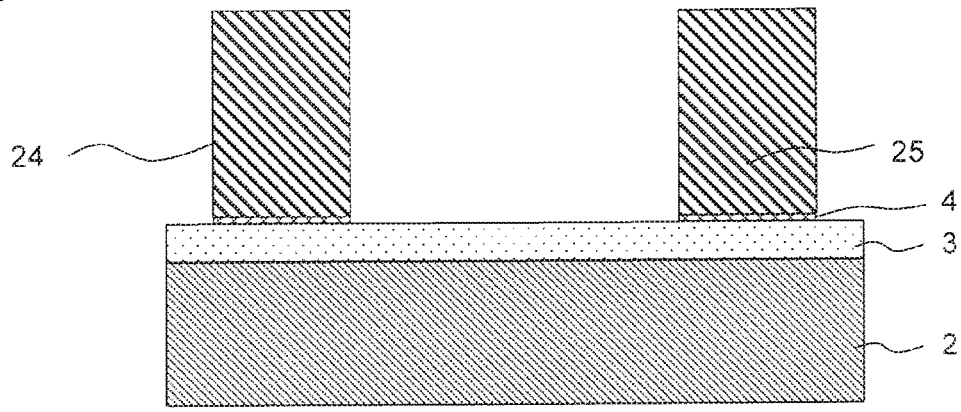
Figure 5C:
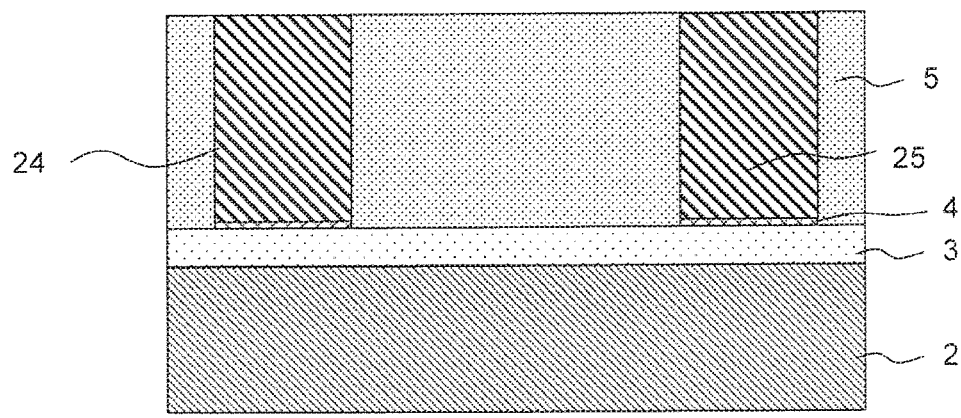

Next, first photoresist 43 is ablated, as illustrated in FIG. 5A. Then, first electrode film 4 is removed by means of milling except for portions where first electrode film 4 is in contact with second and third yokes 24, 25, as illustrated in FIG. 5B. Next, second insulation layer 5 is formed, and second insulation layer 5 that is formed on top of second and third yokes 24, 25 is removed by CMP, as illustrated in FIG. 5C. As a result, the side spaces of second and third yokes 24, 25 are filled with second insulation layer 5.

Then, first intermediate insulation layer 6 is formed by means of sputtering on second insulation layer 5, as illustrated in FIG. 6A. Next, lower lead layers 31, 40 of first and second magnetic field detection elements 21, 22 are formed by means of sputtering on first intermediate insulation layer 6 (support layer), and the side spaces of lower lead layers 31, 40 are filled with third insulation layer 7. Next, Magnetic field sensing films 38, 42 of first and second magnetic field detection elements 21, 22 are formed by means of sputtering on lower lead layers 31, 40 of first and second magnetic field detection elements 21, 22, and then the side spaces of magnetic field sensing films 38, 42 are filled with fourth insulation layer 8. Then, upper lead layers 37, 41 of first and second magnetic field detection elements 21, 22 are formed by means of sputtering on magnetic field sensing films 38, 42 of first and second magnetic field detection elements 21, 22, and then the side spaces of upper lead layers 37, 41 are filled with fifth insulation layer 9. Thereafter, second intermediate insulation layer 10 is formed by means of sputtering on upper lead layers 37, 41 of first and second magnetic field detection elements 21, 22 and on fifth insulation layer 9. Next, second electrode film 12 is formed on second intermediate insulation layer 10, as illustrated in FIG. 6B.

Figure 7A:
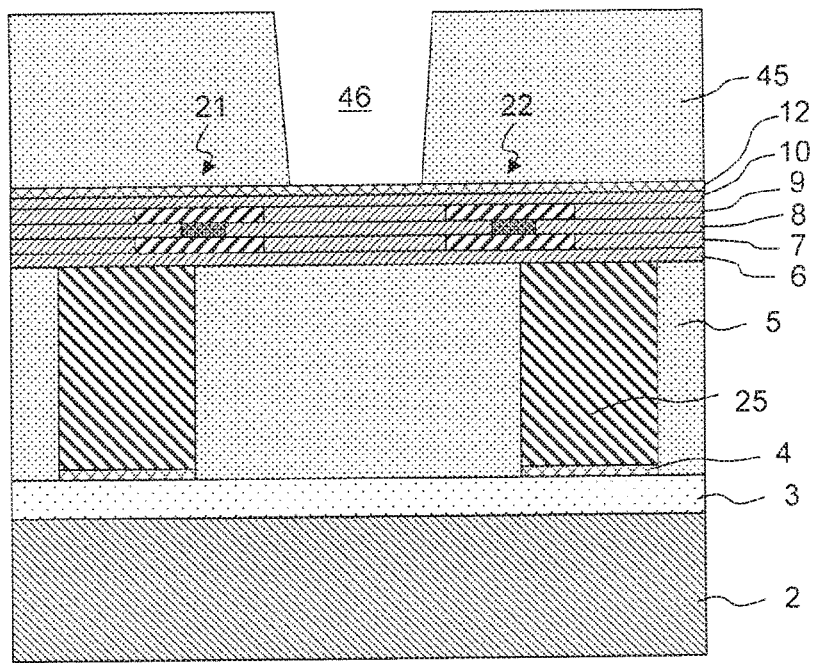
Figure 7B:
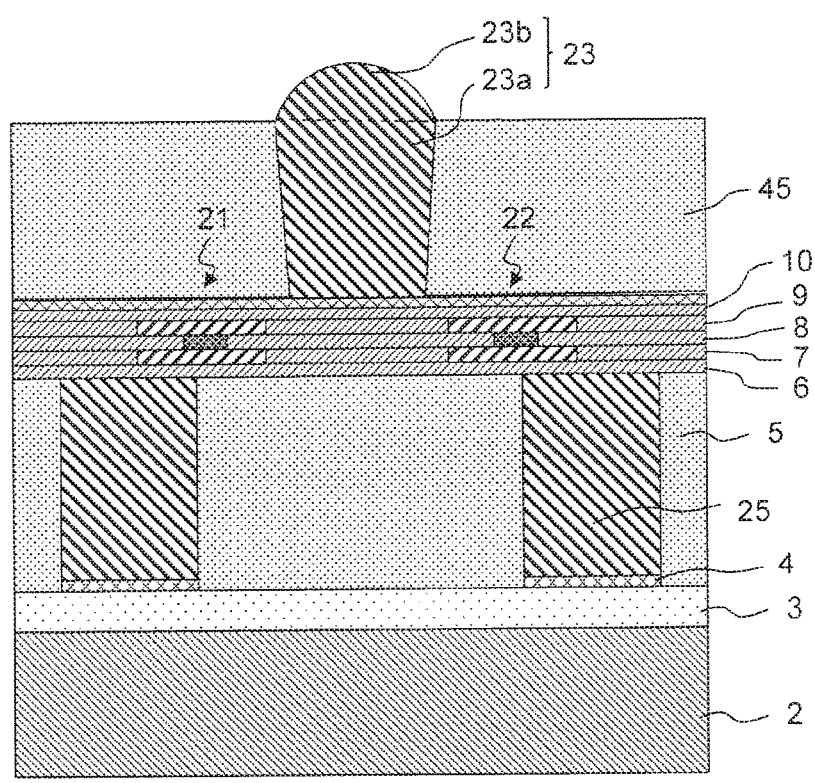

Then, second photoresist 45 is formed on second electrode film 12, and second hole 46 for forming first portion 23a of first yoke 23 therein is formed by exposure and development processes, as illustrated in FIG. 7A. Second hole 46 extends in second direction Z from the upper surface of photoresist 45. Next, first portion 23a of first yoke 23 is formed in second hole 46 by means of plating, as illustrated in FIG. 7B. Second hole 46 is completely filled with first portion 23a. In addition, the plating step is further performed after first portion 23a is formed, and second portion 23b is formed on first portion 23a. Second portion 23b is formed in a curved shape due to the surface tension of the melted plating material since second portion 23b is formed outside of second photoresist 45. The plating step is completed before second portion 23b protrudes laterally to the outside of first portion 23a, when viewed in direction Z. Then, second photoresist 45 is ablated, second electrode film 12 that is not in contact with first yoke 23 is removed, sixth insulation layer 11 is formed in the side spaces of first portion 23a and second portion 23b of first yoke 23, and the configuration illustrated in FIG. 1 is obtained.

Figure 2B:
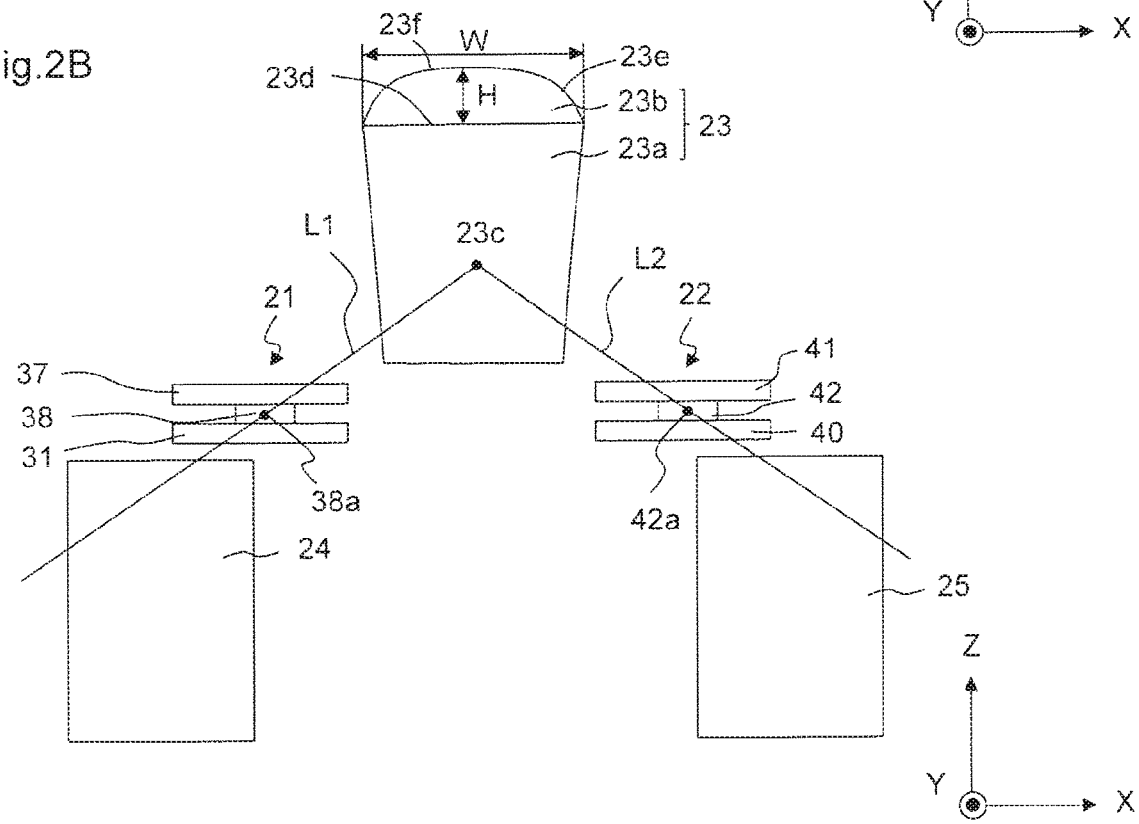
Figure 8:
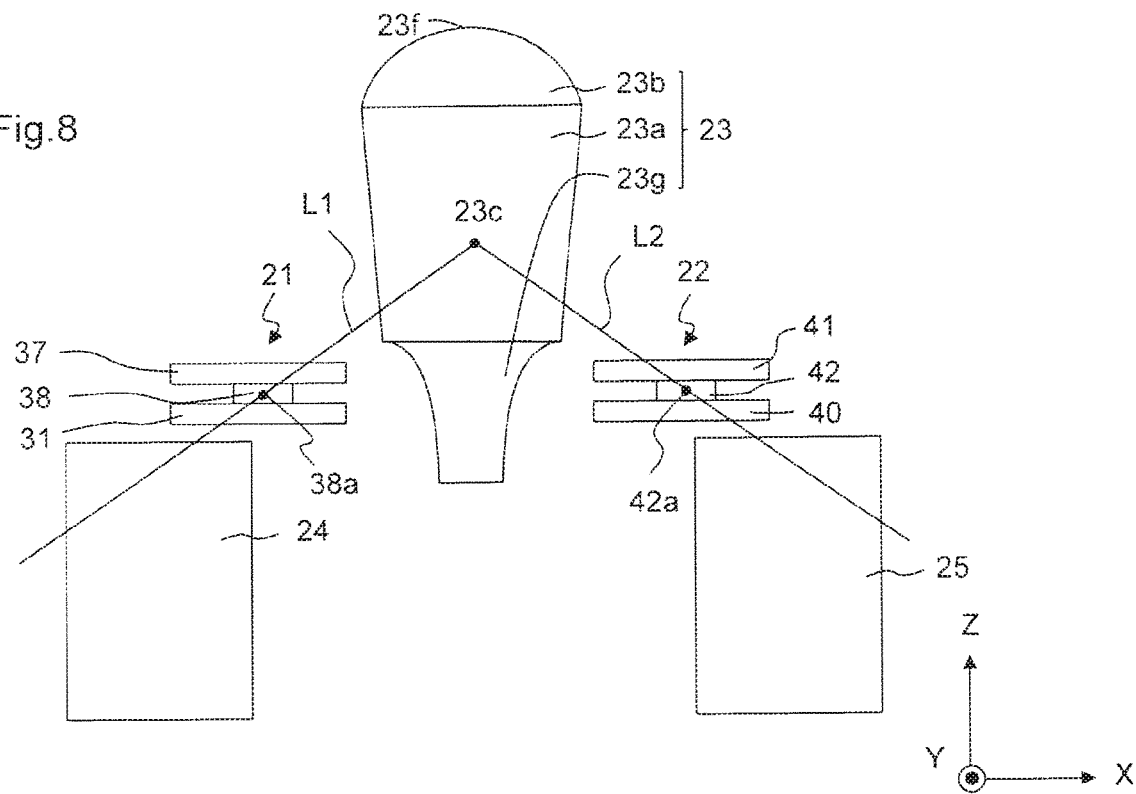
FIG. 8 is a diagram similar to FIGS. 2A and 2B illustrating a magnetic sensor according to a second embodiment of the present invention.

FIG. 8 is a diagram similar to FIGS. 2A and 2B illustrating a magnetic sensor of a second embodiment of the present invention. In the present embodiment, first yoke 23 includes third portion 23g that is located on the side opposite to second portion 23b with respect to first portion 23a. Third portion 23g faces first and second magnetic field detection elements 21, 22, especially, magnetic field sensing films 38, 42 of first and second magnetic field detection elements 21, 22 with respect to first direction X. Since first yoke 23 is formed so deeply that first yoke 23 faces first and second magnetic field detection elements 21, 22 in first direction X, the magnetic flux is further inclined toward direction X at the positions of first and second magnetic field detection elements 21, 22. As a result, output of magnetic sensor 1 in direction X can be further enhanced.

Figure 9A:
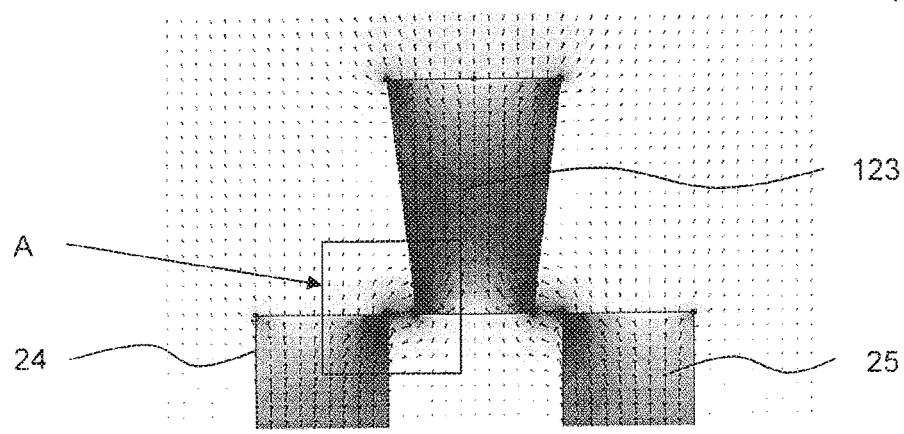
FIGS. 9A to 9C are results of simulating magnetic field in Comparative Examples 1, 2 and Example, respectively.
Figure 9B:
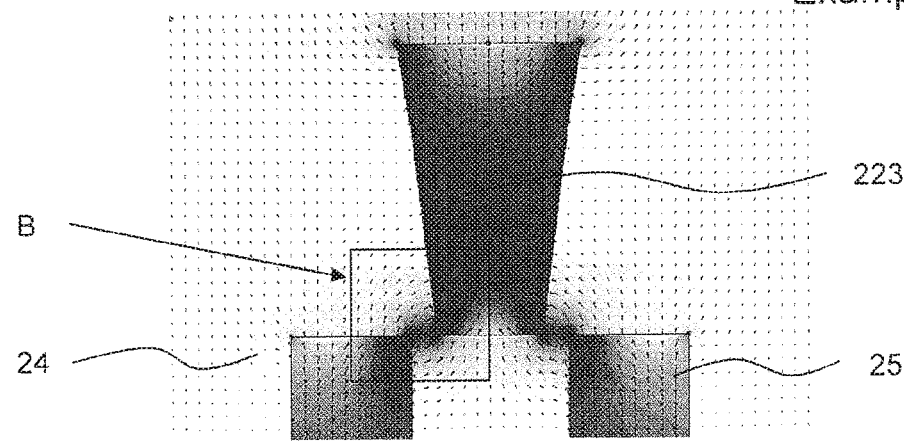
Figure 9C:
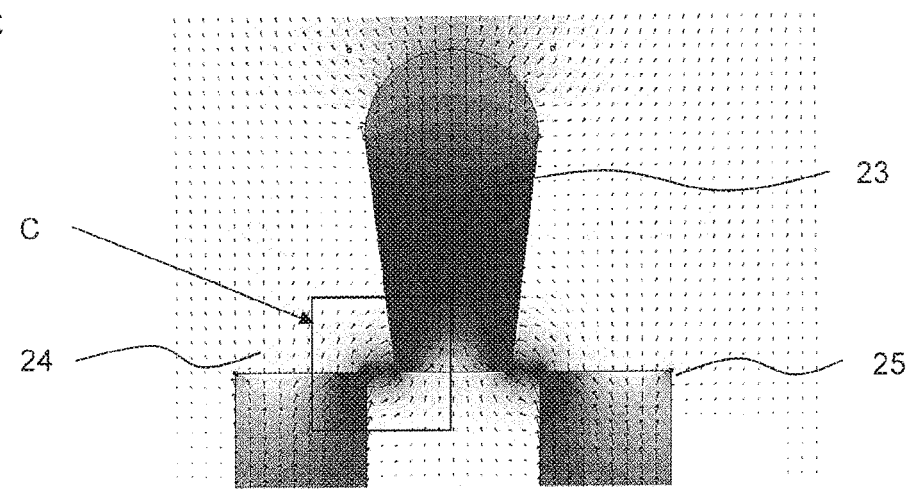

FIGS. 9A to 9C show the results of simulating magnetic field in Comparative Examples 1, 2 and Example, respectively. FIGS. 10A, to 10C illustrate enlarged views near first and second magnetic field detection elements 21, 22. FIGS. 10A to 10C illustrate the enlarged views of part A of FIG. 9A, part B of FIG. 9B, and part C of FIG. 9C, respectively. The white square in FIGS. 10A to 10C roughly indicates the position of first magnetic field sensing film 38. FIG. 9A and FIG. 10A show simulation results of Comparative Example 1 in which the total height of first yoke 123 is small. In the figure, the length of the arrow indicates the intensity of the magnetic flux, and the direction of the arrow indicates the direction of the magnetic flux. Since first magnetic field sensing film 38 detects a magnetic field of direction X, it is preferred that the arrow be inclined toward direction X as much as possible and be as long as possible at the position of first magnetic field sensing film 38. FIG. 9B and FIG. 10B show the simulation result of Comparative Example 2 in which the total height of first yoke 223 is higher than that of Comparative Example 1. As compared to Comparative Example 1, the magnetic flux is inclined about the same level at the position of first magnetic field sensing film 38, but the intensity of the magnetic flux is increased. FIG. 9C and FIG. 10C show the simulation result of Example in which second portion 23b has a rounded end portion. The total height of first portion 23a is about the same as that of first yoke 123 of Comparative Example 1, and the total height of first yoke 23 is about the same as that of first yoke 223 of Comparative Example 2. The magnetic flux is inclined about the same level as Comparative Examples 1, 2. The intensity of the magnetic flux is slightly smaller than that of Comparative Example 2 but is larger than that of Comparative Example 1.

On the other hand, as described in the above description of the manufacturing method, first yoke 23 is formed in second hole 46 of second photoresist 45 by means of plating. Accordingly, in case of first yoke 223 of Comparative Example 2 that is generally elongate, second hole 46 is also deep and elongate. However, it will be difficult for the plating process to ensure an accurate shape for holes that are deep and elongate, and this may cause a deterioration in the accuracy with which first yoke 223 is formed. In Example, however, a photoresist needs not be used to form second portion 23b of first yoke 23 having the rounded end portion because second portion 23b is formed in a rounded end shape due to the surface tension, as described above. Accordingly, first yoke 23 can be formed in a hole of a photoresist having about the same depth as that of Comparative Example 1, and therefore it is easy to ensure that yoke 23 is accurately formed.

Consequently, it is possible in the present embodiment to obtain a magnetic field sensor which is easy to ensure that first yoke 23 is accurately formed and in which first yoke 23 has a large magnetic flux density.

LIST OF REFERENCE NUMERALS

1 Magnetic sensor
21 First magnetic field detection element
22 Second magnetic field detection element
23 First yoke
23a First portion of the first yoke
23b Second portion of the first yoke
23d Interface between first portion 23a and second portion 23b
23g Third portion of the first yoke
24 Second yoke
25 Third yoke
31 Lower lead of the first magnetic field detection element
33 Magnetization fixed layer
34 Spacer layer
35 Magnetization free layer
37 Upper lead of the first magnetic field detection element
38 First magnetic field sensing film
40 Lower lead of the second magnetic field detection element
41 Upper lead of the second magnetic field detection element
42 Second magnetic field sensing film
X First direction
Z Second direction

What is claimed is:

1. A magnetic sensor comprising:
 a substrate;
 a magnetic field detection element that is provided above the substrate and that detects a magnetic field in a first direction; and
 a yoke that is provided above the substrate and is located near the magnetic field detection element and that extends in a second direction that is orthogonal to the first direction,
 wherein the yoke includes a first portion that is located away from the magnetic field detection element at least in the first direction and a second portion that is located farther away from the substrate than the first portion with respect to the second direction,
 the second portion has a surface that is opposite to an interface with the first portion,
 the surface has a curved shape that protrudes in a direction away from the substrate and the first portion in the second direction, and
 a maximum height of the second portion in the second direction is about ¼ or more and about ½ or less of a width of an interface between the first portion and the second portion in the first direction.

2. The magnetic sensor according to claim 1, wherein a width of the first portion in the first direction monotonically increases toward the second portion.

3. The magnetic sensor according to claim 1, wherein
 the yoke includes a third portion that is located on a side opposite to the second portion with respect to the first portion, and
 the third portion faces the magnetic field detection element with respect to the first direction.

4. The magnetic sensor according to claim 1, wherein
the magnetic field detection element includes a magnetic field sensing film and a pair of leads that supply sense current to the magnetic field sensing film,
the first direction is orthogonal to a film thickness direction of the magnetic field sensing film,
the second direction is parallel to the film thickness direction,
the magnetic field sensing film detects a magnetic field in the first direction, and
the pair of leads sandwich the magnetic field sensing film in the second direction.

5. The magnetic sensor according to claim 4, wherein the yoke is a first yoke, and the magnetic sensor further comprises a second yoke that is located on a side opposite to the first yoke with respect to the magnetic field sensing film, the second yoke lying on an extended line of a straight line that connects a center of the first yoke to a center of the magnetic field sensing film.

6. The magnetic sensor according to claim 1, wherein the yoke has a larger dimension in the second direction than in the first direction.

* * * * *